(12) United States Patent
Matsuura et al.

(10) Patent No.: US 9,773,647 B2
(45) Date of Patent: Sep. 26, 2017

(54) PLASMA PROCESSING APPARATUS AND UPPER ELECTRODE ASSEMBLY

(71) Applicant: TOKYO ELECTRON LIMITED, Tokyo (JP)

(72) Inventors: Shin Matsuura, Miyagi (JP); Jun Young Chung, Gyeonggi-do (KR); Keita Kambara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 266 days.

(21) Appl. No.: 14/792,755

(22) Filed: Jul. 7, 2015

(65) Prior Publication Data

US 2016/0013028 A1 Jan. 14, 2016

(30) Foreign Application Priority Data

Jul. 11, 2014 (JP) ................. 2014-143292

(51) Int. Cl.
*H01J 37/32* (2006.01)
*H01L 21/67* (2006.01)
(Continued)

(52) U.S. Cl.
CPC .. *H01J 37/32568* (2013.01); *C23C 16/45565* (2013.01); *H01J 37/32522* (2013.01);
(Continued)

(58) Field of Classification Search
CPC ........... H01J 37/32807; H01J 37/32605; H01J 37/32568; H01J 37/32522;
(Continued)

(56) References Cited

U.S. PATENT DOCUMENTS 6,019,060 A * 2/2000 Lenz ................. H01J 37/32623
118/723 R
6,899,786 B2 * 5/2005 Senzaki ............ H01J 37/32458
118/715
(Continued)

FOREIGN PATENT DOCUMENTS

JP 2010-251752 A 11/2010
JP 3167751 U 5/2011
JP 2011-521472 A 7/2011

*Primary Examiner* — Rakesh Dhingra
*Assistant Examiner* — Laureen Chan
(74) *Attorney, Agent, or Firm* — Rothwell, Figg, Ernst & Manbeck, P.C.

(57) ABSTRACT

A plasma processing apparatus includes supporting members, connecting members, a rotation member and fixing members. Each of the supporting members is partially disposed in a disc-shaped cooling plate and configured to support an upper electrode provided below the cooling plate. Each of the connecting members is partially disposed in the cooling plate and extends in a diametrical direction of the cooling plate to be engaged with the corresponding supporting member. The rotation member is provided to surround an outer periphery of the cooling plate and has recesses formed to face the cooling plate and engaged with the corresponding connecting members. Each of the fixing members is configured to lift and fix the upper electrode to the cooling plate by applying a torque to the corresponding connecting member.

9 Claims, 6 Drawing Sheets (51) Int. Cl.
*H05H 1/46* (2006.01)
*C23C 16/455* (2006.01)

(52) U.S. Cl.
CPC .. *H01J 37/32532* (2013.01); *H01L 21/67069* (2013.01); *H01L 21/67109* (2013.01)

(58) Field of Classification Search
CPC ......... H01J 37/32532; C23C 16/45565; H01L 21/67069; H01L 21/67109
See application file for complete search history.

(56) References Cited

U.S. PATENT DOCUMENTS

| | | | |
|---|---|---|---|
| 2004/0265131 A1* | 12/2004 | Tseng .................. | F04D 25/088 416/206 |
| 2010/0003824 A1* | 1/2010 | Kadkhodayan ... | H01J 37/32091 438/710 |
| 2010/0003829 A1* | 1/2010 | Patrick ................ | C23C 16/4557 438/758 |
| 2010/0261354 A1* | 10/2010 | Bettencourt ............ | H01J 37/16 438/710 |
| 2011/0070740 A1* | 3/2011 | Bettencourt ........ | H01J 37/3244 438/710 |
| 2011/0083809 A1* | 4/2011 | de la Llera ....... | H01J 37/32091 156/345.34 |
| 2012/0175062 A1* | 7/2012 | de la Llera ....... | H01J 37/32091 156/345.34 |

* cited by examiner

PLASMA PROCESSING APPARATUS AND UPPER ELECTRODE ASSEMBLY

CROSS-REFERENCE TO RELATED APPLICATIONS

This application claims priority to Japanese Patent Application No. 2014-143292 filed on Jul. 11, 2014, the entire contents of which are incorporated herein by reference.

FIELD OF THE INVENTION

The disclosure relates to a plasma processing apparatus and an upper electrode assembly.

BACKGROUND OF THE INVENTION

Conventionally, a plasma processing apparatus for performing plasma processing is widely used in a semiconductor manufacturing process such as etching, deposition, oxidation, sputtering or the like.

Generally, a capacitively coupled plasma processing apparatus has a configuration in which an upper electrode and a lower electrode are disposed in parallel to each other in a processing chamber configured as a vacuum chamber. In this configuration, a target substrate (a semiconductor wafer, a glass substrate or the like) is mounted on the lower electrode and a high frequency is applied to one of the electrodes. As a consequence, electrons accelerated by a high frequency electric field generated between both electrodes, secondary electrons emitted from the electrodes, or heated electrons are made to collide with and ionize molecules of a processing gas. As a result, a plasma of the processing gas is generated and a desired fine processing, e.g., an etching process, is performed on a surface of the substrate by radicals or ions in the plasma. In the etching process, there is widely used a dual frequency application type in which a first high frequency power having a relatively high frequency (typically, about 40 MHz or above) for plasma generation (discharge) is applied to the upper electrode or the lower electrode and a second high frequency power having a relatively low frequency (typically about 13.56 MHz or less) for ion attraction to a substrate is applied to the lower electrode. In addition, in the capacitively coupled plasma processing apparatus, there is employed a type in which a plasma is generated between both electrodes by the above-described high frequency discharge and a DC voltage is applied to the upper electrode facing the substrate across the plasma(see, Japanese Patent Application Publication Nos. 2010-251752 and 2011-521472, Japanese Utility Model Registration No. 3167751).

There is proposed a cam lock for mechanically attaching the upper electrode to a receiving plate in the above plasma processing apparatus. In the proposed mechanism, a stud that is press-fitted to a socket above the electrode is engaged with a cam shaft surrounded by a cam bearing in the receiving plate. The cam lock is realized by rotating the cam shaft through an opening formed at an outer peripheral surface of the receiving plate.

However, in such a mechanism, it is difficult to finely control a force of lifting the upper electrode.

SUMMARY OF THE INVENTION

In view of the above, the disclosure provides a plasma processing apparatus and an upper electrode assembly which can flexibly control a force of lifting an upper electrode.

In accordance with an embodiment of the disclosure, there is provided a plasma processing apparatus including: supporting members, each of which is partially disposed in a disc-shaped cooling plate and configured to support an upper electrode provided below the cooling plate; connecting members, each of which is partially disposed in the cooling plate and extends in a diametrical direction of the cooling plate to be engaged with the corresponding supporting member; a rotation member provided to surround an outer periphery of the cooling plate, the rotation member having recesses formed to face the cooling plate and engaged with the corresponding connecting member; and fixing members, each of which is configured to lift and fix the upper electrode to the cooling plate by applying a torque to the corresponding connecting member.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments of a plasma processing apparatus will be described in detail with reference to the accompanying drawings. The disclosure is not limited to those embodiments.

(Example of a Conventional Plasma Processing Apparatus)

Figure 7:
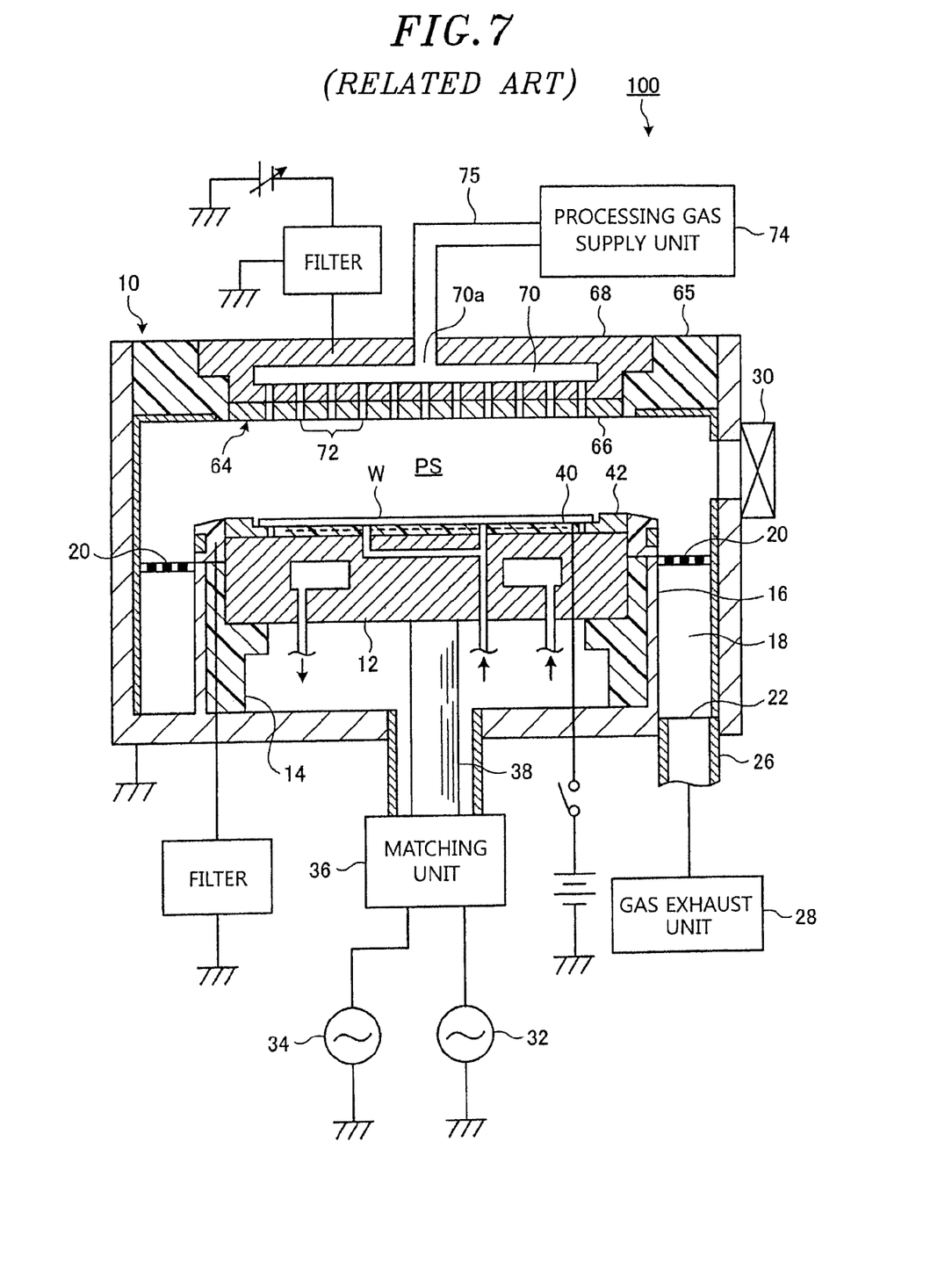
FIG. 7 shows an example of a configuration of a conventional plasma processing apparatus.

First, an example of a conventional plasma processing apparatus will be described. FIG. 7 shows an example of a configuration of a conventional plasma processing apparatus 100. The plasma processing apparatus 100 is configured as a capacitively coupled plasma etching apparatus including parallel plate-shaped electrodes. The plasma processing apparatus 100 includes a cylindrical chamber (processing chamber) 10 made of a metal such as aluminum, stainless steel or the like.

A circular plate-shaped susceptor 12 for mounting thereon a target substrate, e.g., a semiconductor wafer W, is horizontally provided in the chamber 10 and serves as a lower electrode. The susceptor 12 is made of, e.g., aluminum, and supported by an insulating cylindrical support 14 without being grounded. The cylindrical support 14 is made of, e.g., ceramic, and extends vertically upward from a bottom portion of the chamber 10.

An annular gas exhaust line 18 is formed between an sidewall of the chamber 10 and a conductive cylindrical support 16 extending vertically upward from the bottom portion of the chamber 10 along an outer periphery of the cylindrical support 14. An annular baffle plate 20 is provided at an upstream side or an inlet of the gas exhaust line 18. A gas exhaust port 22 is provided at a downstream side of the gas exhaust line 18.

A gas exhaust unit 28 is connected to the gas exhaust port 22 via a gas exhaust line 26. The gas exhaust unit 28 can decrease a pressure in a plasma processing space in the chamber 10 to a desired vacuum level. A gate valve 30 for opening/closing a loading/unloading port for the semiconductor wafer W is provided at an out side of the sidewall of the chamber 10.

A first high frequency power supply 32 and a second high frequency power supply 34 are electrically connected to the susceptor 12 via a matching unit 36 and a power supply rod 38. An electrode chuck 40 for holding the semiconductor wafer W is provided on a top surface of the susceptor 12. A focus ring 42 is provided at a radially outer side of the electrostatic chuck 40 to annularly surround the periphery of the semiconductor wafer W.

An upper electrode 64 of a ground potential serving as a shower head is attached, in an electrically floating state, to a ceiling portion of the chamber 10 through an annular insulator 65 while facing the susceptor 12 in parallel. The upper electrode 64 includes an electrode plate 66 facing the susceptor 12 and an electrode holder 68 for detachably holding the electrode plate 66 from its top side (upper side in FIG. 7). The electrode holder 68 serves as, e.g., a cooling plate, and suppresses temperature variation of the electrode plate 66.

A gas chamber 70 is provided inside the electrode holder 68. A plurality of gas injection holes 72 is formed through the electrode holder 68 and the electrode plate 66 from the gas chamber 70 toward the susceptor 12. A space between the electrode plate 66 and the susceptor 12 becomes a plasma generation space or a processing space PS. A gas supply line 75 from a processing gas supply unit 76 is connected to a gas inlet port 70a provided at an upper portion of the gas chamber 70. The electrode plate 66 is made of, e.g., Si or SiC, and the electrode holder 68 is made of, e.g., alumite-treated aluminum.

(Plasma Processing Apparatus According to an Embodiment)

Figure 1:
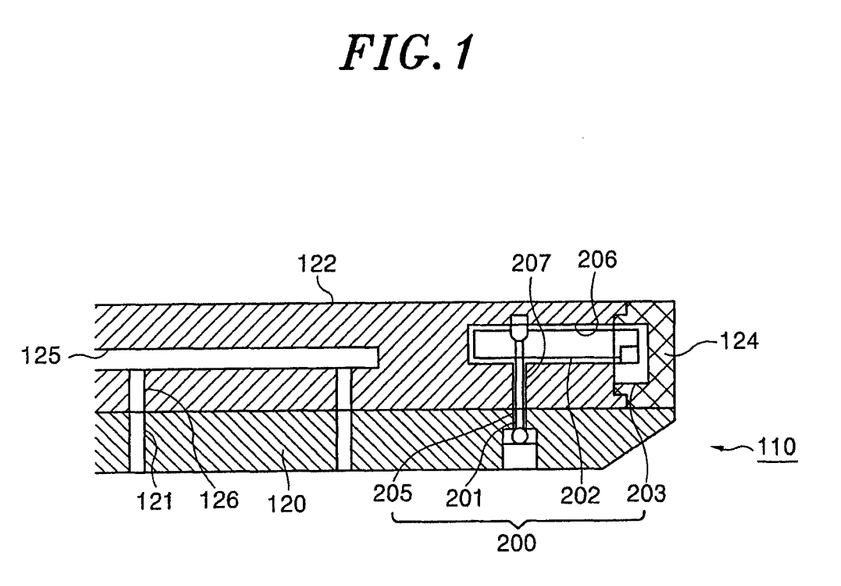
FIG. 1 is a schematic view of an upper electrode assembly of a plasma processing apparatus according to an embodiment.

An upper electrode assembly 110 of the plasma processing apparatus according to an embodiment will be described with reference to FIG. 1. FIG. 1 is a schematic view of the upper electrode assembly 110 of the plasma processing apparatus according to the embodiment. The upper electrode assembly 110 includes a mechanism for lifting the electrode plate to a cooling plate provided above the electrode plate. A configuration of the plasma processing apparatus according to the embodiment is substantially the same as that of the conventional plasma processing apparatus 100 shown in FIG. 7 except that there is provided the upper electrode assembly 110. The plasma processing apparatus according to the embodiment is configured such that an operator can manipulate the upper electrode assembly 110 from a lower side thereof.

The structure shown in FIG. 1 is an example of the structure of the upper electrode assembly 110 of the plasma processing apparatus according to the embodiment, which corresponds to the upper electrode 64 of the conventional plasma processing apparatus 100 shown in FIG. 7. FIG. 1 shows a cross section of a portion including a lifting mechanism 200 (to be described later) of the upper electrode assembly 110.

The upper electrode assembly 110 shown in FIG. 1 may be disposed at a desired position inside the chamber (corresponding to the chamber 10 shown in FIG. 7) of the plasma processing apparatus. However, it is unnecessary to dispose the upper electrode assembly 110 inside the chamber as shown in FIG. 7. For example, the wall surface of the chamber and the upper electrode assembly 110 may not be in contact with each other by allowing another structure to hold the upper electrode assembly 110 from the top.

As shown in FIG. 1, the upper electrode assembly 110 according to the embodiment includes an electrode plate 120 (hereinafter, may be referred to as "upper electrode"), a cooling plate 122, and an outer ring 124 (hereinafter, may be referred to as "rotation member"). The upper electrode assembly 110 serves as a shower head.

The electrode plate 120 is a disc-shaped member substantially corresponding to the electrode plate 66 shown in FIG. 7. A plurality of gas injection holes 121 is formed in the electrode plate 120 so that a processing gas can pass therethrough. The electrode plate 120 is made of, e.g., Si or SiC.

The cooling plate 122 is a disc-shaped member substantially corresponding to the electrode holder 68 shown in FIG. 7. A plurality of gas injection holes 126 are formed in the cooling plate 122. The gas injection holes 126 formed in the cooling plate 122 are connected to the gas injection holes 121 formed in the electrode plate 120 and communicate with a gas chamber 125 formed in the cooling plate 122. The gas chamber 125 has the same function as that of the gas chamber 70 shown in FIG. 7.

The cooling plate 122 is in surface contact with the top surface of the electrode plate 120 to control the temperature of the upper electrode assembly 110. The cooling plate 122 is made of a conductive material, e.g., aluminum having an alumite-treated surface. A heat transfer sheet may be interposed between the electrode plate 120 and the cooling plate 122 in order to increase a heat transfer efficiency. In that case, holes are formed at portions of the heat transfer sheet which correspond to the gas injection holes 121 formed in the electrode plate 120 and the gas injection holes 126 formed in the cooling plate 122.

The outer ring 124 is an annular member surrounding the outer periphery of the cooling plate 122. The outer ring 124 is engaged with the cooling plate 122 by a flange or the like provided at the outer periphery of the cooling plate 122. The type of engagement between the cooling plate 122 and the outer ring 124 is not particularly limited as long as the operation of the lifting mechanism 200 (see FIG. 2) to be described later is not disturbed.

(Summary of the Lifting Mechanism 200)

Figure 2:
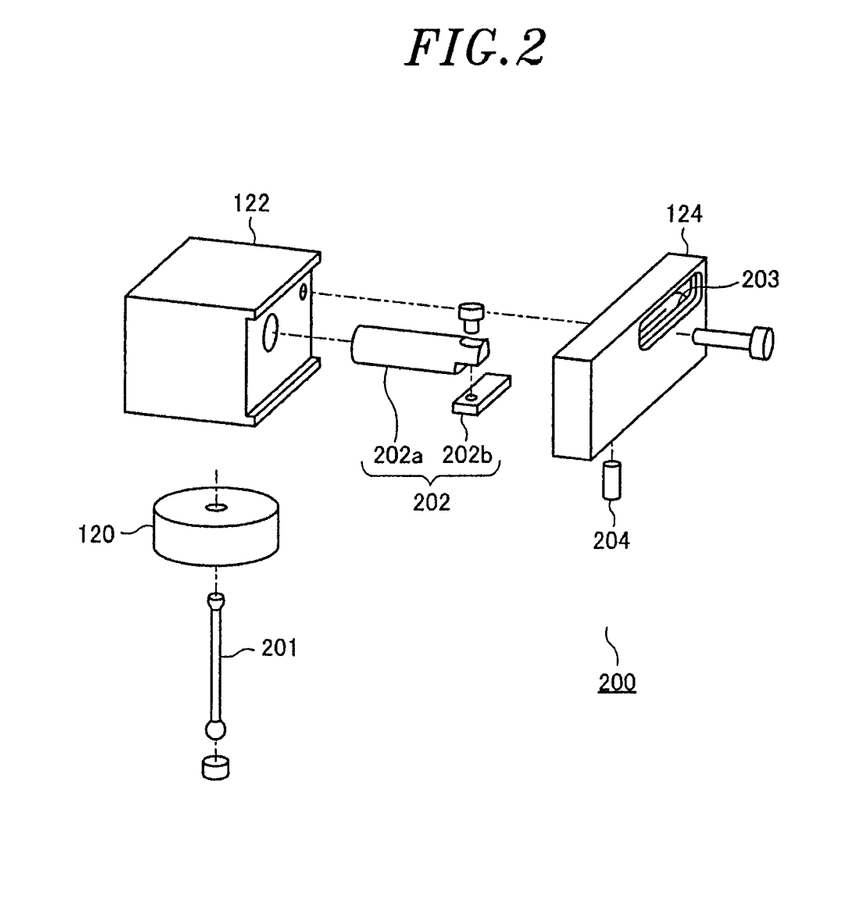
FIG. 2 is an exploded perspective view of a test model of a lifting mechanism according to the embodiment.

The lifting mechanism 200 of the upper electrode assembly 110 according to the embodiment will be described with reference to FIGS. 1 and 2. FIG. 2 is a schematic view of a test model of the lifting mechanism 200 according to the embodiment. In FIG. 2, there is illustrated the test model in which the electrode plate 120, the cooling plate 122 and the outer ring 124 are formed in simple shapes for easy understanding. In the structure shown in FIG. 2, the electrode plate 120 supported by a supporting member 201 is illustrated as a substantially circular small plate-shaped member. Partial structures of the cooling plate 122 and the outer ring 124 are illustrated as substantially cubic members, instead of a disc-shaped member and a ring-shaped member.

The lifting mechanism 200 can lift the electrode plate 120 to the bottom of the cooling plate 122 by the engagement of the electrode plate 120, the cooling plate 122 and the outer ring 124.

Specifically, the lifting mechanism 200 includes the supporting member 201, a connecting member 202, a recess 203 (see FIGS. 5A to 5D) formed at the outer ring 124, and a fixing member 204 (see FIG. 2).

The supporting member 201 is inserted into a hole 205 formed in the electrode plate 120 in a vertical direction thereof (a vertical direction in FIG. 1) and supports the electrode plate 120 in the vertical direction. The supporting member 201 is configured as, e.g., a pin having a cylindrical shaft and substantially spherical end portions provided at both ends of the shaft. The shape of the pin is not as long as it can support the electrode plate 120 in the vertical direction. For example, it is possible to prevent the lower spherical end portion of the supporting member 201 from being detached upward by forming, in the electrode plate 120, the hole 205 having an upper diameter smaller than a lower diameter(see FIGS. 1 and 3).

The connecting member 202 is formed by clamping a flat plate-shaped lever 202b to an at least partially hollow cylindrical shaft 202a by a screw (see FIG. 2). Or, the connecting member 202 may be formed as one unit by using a mold or the like. The shaft 202a has a notch 202a1 (see FIGS. 6A to 6C). When the shaft 202a is located at a predetermined position in an hole 206 formed in the cooling plate 122 in a diametrical direction thereof, the notch 202a1 is positioned above an hole 207 formed in the cooling plate 122 in a vertical direction thereof. The hole 207 communicates with the hole 206 formed in the cooling plate 122 and the hole 205 formed in the electrode plate 120. The supporting member 201 is inserted into the hole 207.

Figure 6A:
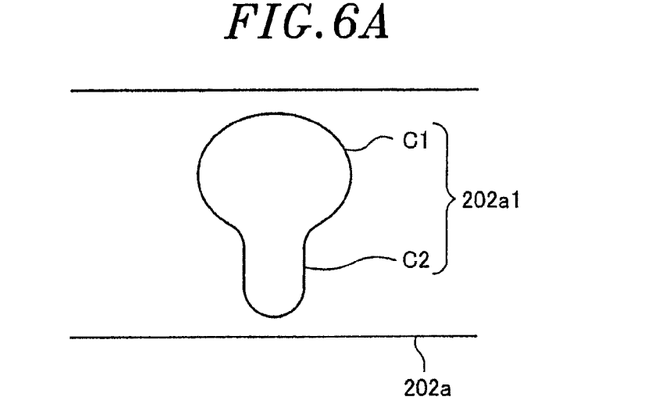
FIG. 6A is a schematic view of a notch of a connecting member of the lifting mechanism according to the embodiment.

FIG. 6A is a schematic view of the notch 202a1 of the connecting member 202 of the lifting mechanism 200 according to the embodiment. As shown in FIG. 6A, the notch 202a1 has a circular part C1 having a size that allows the upper (upper side in FIG. 1) spherical end portion of the supporting member 201 to be accommodated. The notch 202a1 has a circular part C2 having a size that allows the shaft of the supporting member 201 to be accommodated. The notch 202a1 has a shape obtained by smoothly connecting contours of the circular parts C1 and C2. When the connecting member 202 is in a released position to be described later, the circular part C1 of the notch 202a1 faces downward in the vertical direction. When the connecting member 202 is in a temporarily fixed position to be described later, the circular part C2 of the notch 202a1 faces downward in the vertical direction.

Figure 6B:
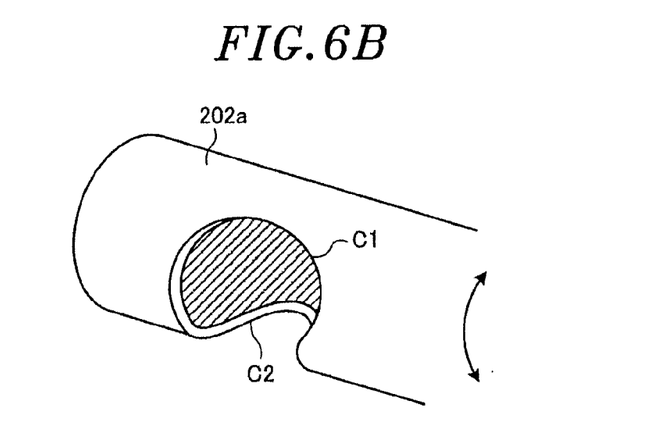
FIG. 6B is a perspective view of the notch of the connecting member of the lifting mechanism according to the embodiment.
Figure 6C:
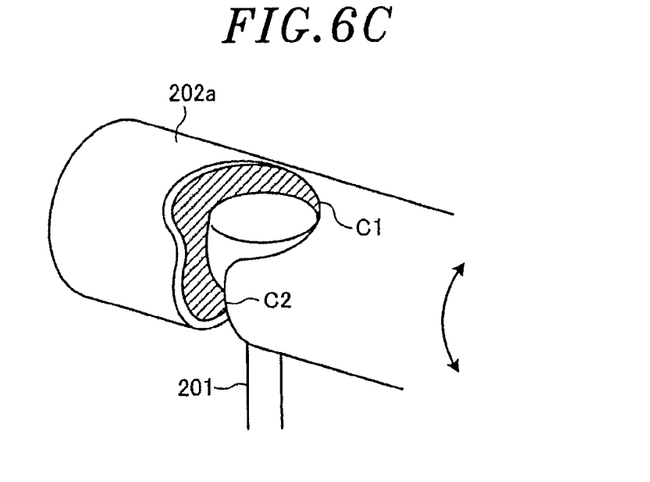
FIG. 6C shows a supporting unit engaged with the notch of the connecting member of the lifting mechanism according to the embodiment.

FIG. 6B is a perspective view of the notch 202a1 of the connecting member 202 of the lifting mechanism 200 according to the embodiment. FIG. 6C shows the supporting member 201 engaged with the notch 202a1 of the connecting member 202 of the lifting mechanism 200 according to the embodiment. The supporting member 201 is inserted into the holes 205 and 207 and engaged with the circular part C1 of the notch 202a1 of the connecting member 202. Next, the shaft 202a is rotated. Accordingly, the circular part C2 faces downward in the vertical direction and the supporting member 201 is prevented from being detached downward. As a result, the supporting member 201 is temporarily fixed (see FIG. 6C).

The lever 202b is clamped by a screw or the like to an end portion of the shaft 202a which is close to the outer ring 124 (see FIG. 2). By rotating the lever 202b about the shaft 202a, it is possible to rotate the notch 202a1 of the shaft 202a and fix the spherical end portion of the supporting member 201 which is engaged with the notch 202a1. The shaft 202a and the lever 202b function as a part of a cam mechanism. The shape of the end portion of the supporting member 201 and the shape of the notch 202a1 to be engaged with the end portion are not particularly limited, as long as the supporting member 201 can be fixed by rotating the shaft 202a by the lever 202b.

Figure 5A:
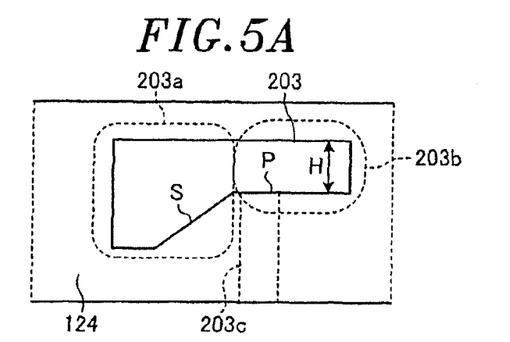
FIG. 5A shows a part of an inner peripheral surface of an outer ring to explain an operation of the lifting mechanism according to the embodiment.
Figure 5B:
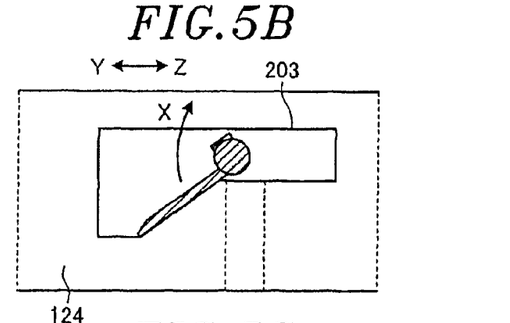
FIG. 5B shows a recess of the outer ring to explain a position of a lever in the case where the lifting mechanism according to the embodiment is released.
Figure 5C:
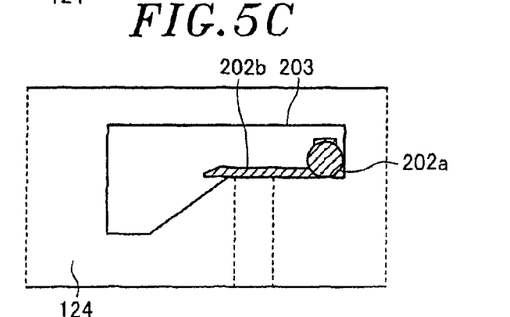
FIG. 5C shows the recess of the outer ring to explain a position of the lever in the case where the lifting mechanism according to the embodiment is temporarily fixed.
Figure 5D:
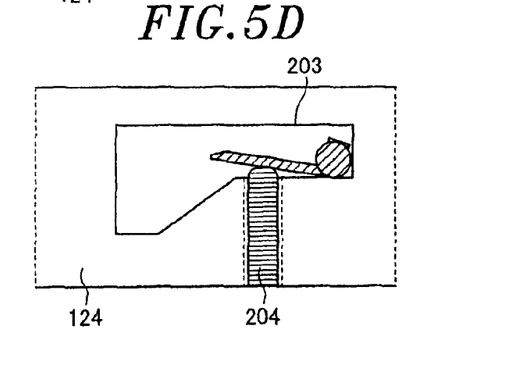
FIG. 5D shows the recess of the outer ring to explain a position of the lever in the case where the lifting mechanism according to the embodiment is fixed.

The recess 203 is formed at the inner peripheral surface of the outer ring 124 and faces the outer peripheral surface of the cooling plate 122. Hereinafter, the type of engagement between the recess 203 and the connecting member 202 will be described with reference to FIGS. 5A to 5D. FIG. 5A shows a part of the inner peripheral surface of the outer ring 124 to explain the operation of the lifting mechanism 200 according to the embodiment. FIG. 5B shows the recess 203 of the outer ring 124 to explain the position of the lever 202b in the case where the lifting mechanism 200 according to the embodiment is released. FIG. 5C shows the recess 203 of the outer ring 124 to explain the position of the lever 202b in the case where the lifting mechanism 200 according to the embodiment is temporarily fixed. FIG. 5D shows the recess 203 of the outer ring 124 to explain the position of the lever 202b in the case where the lifting mechanism 200 according to the embodiment is fixed.

As shown in FIG. 5A, the recess 203 formed at the outer ring 124 includes a first recess 203a and a second recess 203b. The first recess 203a has an inclined surface S whose length is substantially the same as the length of the lever 202b. An inclined angle of the inclined surface S may be substantially the same as an angle formed by a segment connecting the center of C1 of the notch 202a1 of the shaft 202a and the axial center of the shaft 202a and a segment connecting the center of C2 and the axial center of the shaft 202a.

The second recess 203b has a horizontal surface P whose length is substantially the same as the length of the lever 202b and a height H that allows the shaft 202a to be accommodated. The horizontal surface P of the second recess 203b extends in a circumferential direction of the outer ring 124 and continues to the inclined surface S of the first recess 203a.

An hole 203c communicating with the second recess 203b from the lower side in the vertical direction is formed at the outer ring 124. The hole 203c penetrates through the bottom surface of the outer ring 124 and allows the recess 203 to communicate with the outside. The fixing member 204 is inserted into the hole 203c from the lower side thereof and accommodated in the hole 203c. The hole 203c and the fixing member 204 are threaded so that they can be coupled. The hole 203c and the fixing member 204 may be engaged by another structure as long as they can be fixed to each other.

By rotating the outer ring 124 along the outer periphery of the cooling plate 122 in the circumferential direction, the shaft 202a of the connecting member 202 is shifted between one end portion of the horizontal surface P which is close to the inclined surface S (the release position shown in FIG. 5B) and the other end portion of the horizontal surface P which is opposite to the inclined surface S (the temporarily fixed position shown in FIG. 5C). As the shaft 202a is shifted relative to the recess 203, the lever 202b slides on the inclined surface S and the horizontal surface P.

For example, when the outer ring 124 is rotated in a direction of an arrow Y shown in FIG. 5B, the shaft 202a is shifted from the release position (see FIG. 5B) to the temporarily fixed position (see FIG. 5C). As the shaft 202a is shifted, the lever 202b is shifted from the inclined surface S to the horizontal surface P. As the lever 202b is shifted, the shaft 202a is rotated in the X direction shown in FIG. 5B and mounted on the horizontal surface P as shown in FIG. 5C.

On the other hand, when the outer ring 124 is rotated in a direction of an arrow Z shown in FIG. 5B, the shaft 202a is shifted from the temporarily fixed position (see FIG. 5C) to the release position (see FIG. 5B). As the shaft 202a is shifted, the lever 202b is shifted from the horizontal surface P to the inclined surface S. As the lever 202b is shifted, the shaft 202a is rotated in the reverse direction to the X direction shown in FIG. 5B and mounted on the inclined surface S as shown in FIG. 5B.

By inserting the fixing member 204 into the hole 203c from the lower side thereof in the temporarily fixed state shown in FIG. 5C, the fixing member 204 is made to be in contact with the lever 202b and the lever 202b is lifted. Accordingly, the supporting member 201 is fixed to the connecting member 202 by the cam mechanism and the clamping of the electrode plate 120 to the cooling plate 122 is completed.

The fixing member 204 can adjust a torque. The fixing member is, e.g., a plunger. For example, the fixing member 204 has therein an elastic member such as a spring or the like and presses the lever 202b by using the spring. Alternatively, by screwing the fixing member 204 as shown in FIG. 5D, the connecting member 202 and the supporting member 201 are clamped together. As a consequence, the clamping of the electrode plate 120, the cooling plate 122 and the outer ring 124, i.e., the lifting of the electrode plate 120, is completed.

Referring back to FIG. 2, an exemplary sequence of installing the lifting mechanism 200 will be further described. In order to install the lifting mechanism 200, the connecting member 202 is firstly inserted into the hole 206 formed in the cooling plate 122 in the diametrical direction thereof. Then, the outer ring 124 is attached to the outer periphery of the cooling plate 122 and the connecting member 202 is inserted into the recess 203 (rear side of the outer ring 124 in FIG. 2). At this time, the position of the outer ring 124 is adjusted such that the connecting member 202 is located at the release position shown in FIG. 5B. It is also possible to provide a guide or the like at the outer ring 124 in advance so that the connecting member 202 can be smoothly located at the release position.

Next, the supporting member 201 is inserted into the electrode plate 120 from the lower side thereof and the electrode plate 120 is supported by the supporting member 201. Thereafter, the upper end portion of the supporting member 201 is inserted into the hole 207 formed in the cooling plate 122 in the vertical direction thereof and the connecting member 202 is engaged with the notch 202a1. In this state, the outer ring 124 is rotated in the direction of the arrow Y shown in FIG. 5B. Accordingly, the connecting member 202 is shifted from the release position shown in FIG. 5B to the temporarily fixed position shown in FIG. 5C. Then, in the temporarily fixed state, the fixing member 204 is inserted into the hole 203c of the outer ring 124. As a result, the electrode plate 120 is lifted to the cooling plate 122.

Figure 3:
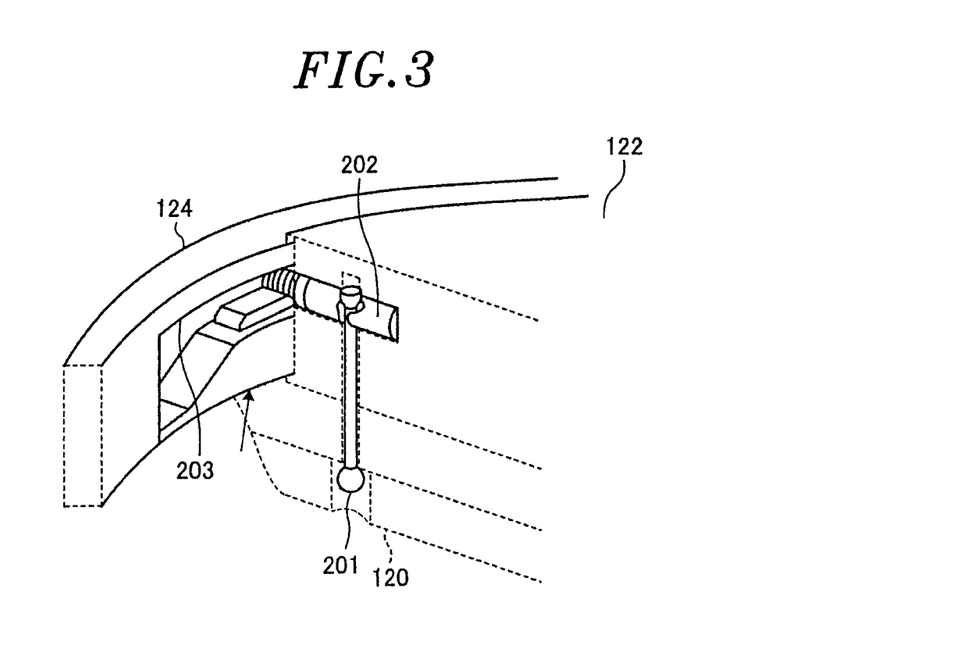
FIG. 3 is a schematic perspective view of the lifting mechanism according to the embodiment.

FIG. 3 is a schematic perspective view of the lifting mechanism 200 according to the embodiment. In FIG. 3, there is illustrated a state where the spherical end portion of the supporting member 201 is engaged with the notch 202a1 of the connecting member 202. In FIG. 3, the lever 202b is positioned on the horizontal surface P. In other words, the lever 202b is in the temporarily fixed position. Therefore, in the state shown in FIG. 3, the lifting of the electrode plate 120 to the cooling plate 122 is not yet completed. In that state, the fixing member 204 is inserted into the hole 203c formed at the bottom surface of the outer ring 124 which is indicated by an arrow in FIG. 3. As a result, the lifting of the electrode plate 120 to the cooling plate 122 is completed.

Figure 4:
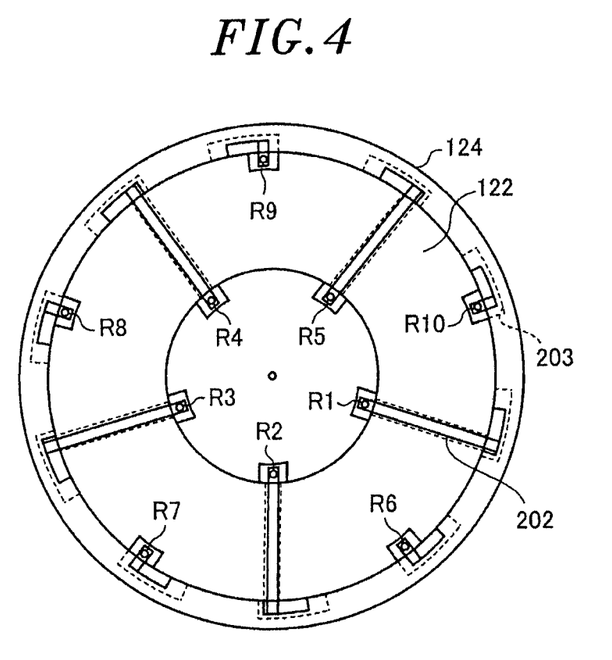
FIG. 4 is a top view of a cooling plate to explain arrangement of components of the lifting mechanism according to the embodiment.

FIG. 4 is a top view of the cooling plate 122 to explain the arrangement of the components of the lifting mechanism 200 according to the embodiment. In the example shown in FIG. 4, holes R1 to R10 through which the supporting members 201 are inserted are formed at ten portions of the cooling plate 122. Among the holes R1 to R10, the holes R1 to R5 are closer to the center of the cooling plate 122 compared to the holes R6 to R10. The lifting mechanism 200 is provided at each of the holes R1 to R10 formed on two concentric circles having different radii from the center of the cooling plate 122, thereby lifting the electrode plate 120 to the cooling plate 122. In that case, members having two different lengths are provided as the connecting members 202.

The locations or the number of the lifting mechanisms 200 may be determined based on conditions such as the weight of the electrode plate 120, the weight of the cooling plate 122, the presence/absence of the heat transfer sheet, and the like.

(Effect of the Embodiment)

As described above, the upper electrode assembly 110 of the plasma processing apparatus according to the embodiment includes: the supporting member 201, partially disposed inside the cooling plate 122, for supporting the upper electrode 120 provided below the cooling plate 122; the connecting member 202, partially disposed in the cooling plate 122, extending in the diametrical direction of the cooling plate 122 to be engaged with the supporting member 201; the rotation member 124 provided along the outer periphery of the cooling plate 122, the connecting member 202 being engaged with the recess 203 formed to face the cooling plate 122; the torque adjustable fixing member 204, configured to lift and fix the upper electrode 120 to the cooling plate 122 by applying a torque to the connecting member 202 inside the recess 203 of the rotation member 124. Therefore, it is possible to adjust the torque by using the fixing member 204 and easily control the force of lifting the upper electrode 120 to the cooling plate 122.

In the plasma processing apparatus according to the embodiment, the supporting member 201, the connecting member 202 and the rotation member 124 constitute the cam mechanism. The upper electrode 120 and the cooling plate 122 are connected by the cam mechanism. Therefore, the upper electrode 120 can be lifted to the cooling plate 122 by a simple structure.

Further, in the plasma processing apparatus according to the embodiment, the fixing member 204 is inserted into the hole 203c that opens at the bottom surface of the rotation member 124 and brought into contact with the connecting member 202 inside the recess 203. Therefore, the lifting force can be easily controlled by manipulating the fixing member 204 in the rotation member 124 from the lower side of the upper electrode 120 without separating an upper structure of the plasma processing apparatus. In the case of exchanging the upper electrode 120, the fixing member 204 can be easily manipulated from the lower side of the upper electrode 120.

Moreover, in the plasma processing apparatus according to the embodiment, the rotation member 124 is rotated between a first rotation position and a second rotation position along the circumferential direction of the cooling plate 122. When the rotation member 124 is in the first rotation position, the connecting member 202 releases the supporting member 201. When the rotation member 124 is in the second rotation position, the connecting member 202 temporarily fixes the supporting member 201. By rotating the rotation member 124 provided around the cooling plate 122, the supporting member 201 can be easily released and the upper electrode 120 can be separated.

In the conventional plasma processing apparatus, it is difficult to exchange the upper electrode without disassembling the structure provided above the upper electrode. However, in the case of employing the configuration of the embodiment, the upper electrode can be easily separated from the lower side and, thus, the consumed upper electrode can be exchanged simply.

In the plasma processing apparatus according to the embodiment, the rotation member 124 has a plurality of recesses 203 to be respectively engaged with a plurality of connecting members 202. By the rotation of the rotation member 124, the connecting members 202 temporarily fix the supporting members 201 corresponding thereto. Therefore, the supporting members 201 provided at multiple locations can be temporarily fixed by the single rotation member 124 and the lifting operation can be simplified.

Further, in the plasma processing apparatus according to the embodiment, the supporting members 201 are inserted into the holes R1 to R10 formed at multiple locations having different distances from the center of the cooling plate 122. Accordingly, the decrease in the interface pressure between the upper electrode 120 and the cooling plate 122 is suppressed. As a result, the interface pressure between the upper electrode 120 and the cooling plate 122 can be improved.

In the conventional plasma processing apparatus, the upper electrode and the cooling plate are clamped by a bolt or the like at an edge portion of the cooling plate. Accordingly, when the upper electrode is consumed, the central portion thereof is hung down, which may result in a decrease in the interface pressure between the upper electrode and the cooling plate. On the other hand, in the embodiment, the cooling plate 122 and the upper electrode 120 are clamped by the supporting members 201 provided at multiple positions spaced from the center of the cooling plate 122 by different distances. Therefore, the decrease in the interface pressure between the upper electrode 120 and the cooling plate 122 is suppressed. Accordingly, the interface pressure between the upper electrode 120 and the cooling plate 122 can be improved. Due to the improvement of the interface pressure, it is possible to suppress temperature variation caused by the consumption of the upper electrode 120. In addition, a life span of the upper electrode 120 can be increased by suppressing variation of an etching rate or the like.

In the plasma processing apparatus according to the embodiment, the supporting members 201 are inserted into the holes R1 to R10 formed on at least two concentric circles having different radii from the center of the cooling plate 122 while being spaced from each other at a regular interval. Therefore, even if the upper electrode 120 is consumed by heat, it is possible to suppress a decrease in a contact pressure between the upper electrode 120 and the cooling plate 122 due to the warpage of the upper electrode 120. Further, the upper electrode 120 can be clamped to the entire cooling plate 122 with a desired clamping force compared to the case of clamping the upper electrode by a bolt, a clamp or the like to the edge portion of the cooling plate as in the conventional plasma processing apparatus. Accordingly, the warpage of the upper electrode 120 by the consumption or the decrease in the interface pressure can be suppressed. Due to the improvement of the interface pressure, it is possible to suppress temperature variation caused by the consumption of the upper electrode 120. Further, a life span of the upper electrode 120 can be increased by suppressing variation of an etching rate or the like.

In the plasma processing apparatus according to the embodiment, the fixing member 204 is a plunger. The clamping force of the plunger can be easily managed. In the case of providing a plurality of supporting members 210, the lifting operation can be completed while maintaining the clamping force at a constant level at each of the supporting members 210. As a result, the lifting force can be easily managed and the fine torque control can be realized by a simple configuration.

(Other Embodiments)

While the plasma processing apparatus according to the embodiment has been described, various modifications can be made within the scope of the disclosure.

For example, the shape of the recess 203 formed at the rotation member 124 can be changed to easily exchange the upper electrode 120 while preventing the separation of the supporting member 201.

The lifting force can be controlled by adjusting the length of the lever 202b of the connecting member 202.

The locations or the number of the supporting members 201 may be appropriately changed based on the size or the weight of the cooling plate 122 and the electrode plate 120, and the presence/absence of the heat transfer sheet.

While the disclosure has been shown and described with respect to the embodiments, it will be understood by those skilled in the art that various changes and modifications may be made without departing from the scope of the disclosure as defined in the following claims.

What is claimed is:

1. A plasma processing apparatus comprising: supporting members, each of which is partially disposed in a disc-shaped cooling plate and configured to support an upper electrode provided below the cooling plate; connecting members, each of which is partially disposed in the cooling plate and extends in a diametrical direction of the cooling plate to be engaged with the corresponding supporting member wherein each of the connecting members comprises a shaft and a lever; a rotation member provided to surround an outer periphery of the cooling plate, the rotation member having recesses formed to face the cooling plate and engaged with the corresponding connecting members; and fixing members, each of which is configured to lift and fix the upper electrode to the cooling plate by applying a torque by way of the lever of the corresponding connecting member.

2. The plasma processing apparatus of claim 1, wherein the supporting members, the connecting members and the rotation member constitute cam mechanisms, and the upper electrode and the cooling plate are connected by the cam mechanisms.

3. The plasma processing apparatus of claim 1, wherein each of the fixing members is inserted into a hole that opens at a bottom surface of the rotation member and brought into contact with the corresponding connecting member inside corresponding the recess of the rotation member.

4. The plasma processing apparatus of claim 1, wherein the rotation member is rotated between a first rotation position and a second rotation position along a circumferential direction of the cooling plate,
wherein when the rotation member is in the first rotation position, each of the connecting members releases the corresponding supporting member and when the rotation member is in the second rotation position, each of the connecting members temporarily fixes the corresponding supporting member.

5. The plasma processing apparatus of claim 1,
wherein each of the connecting members temporarily fix the corresponding supporting members by the rotation of the rotation member.

6. The plasma processing apparatus of claim 1, wherein the supporting members are respectively inserted into holes formed at multiple locations spaced from a center of the cooling plate by different distances.

7. The plasma processing apparatus of claim 1, wherein the supporting members are respectively inserted into holes formed on at least two concentric circles having different radii from a center of the cooling plate while being spaced from each other at a regular interval.

8. The plasma processing apparatus of claim 1, wherein the fixing members are plungers.

9. An upper electrode assembly, comprising: supporting members, each of which is partially disposed in a disc-shaped cooling plate and configured to support an upper electrode provided below the cooling plate; connecting members, each of which is partially disposed in the cooling plate and extends in a diametrical direction of the cooling plate to be engaged with the corresponding supporting member wherein each of the connecting members comprises a shaft and a lever; a rotation member provided to surround an outer periphery of the cooling plate, a rotation member having recesses formed to face the cooling plate and engaged with corresponding the connecting members; and fixing members, each of which is configured to lift and fix the upper electrode to the cooling plate by applying a torque by way of the lever of the corresponding connecting member.

* * * * *